US012765093B2

(12) United States Patent
Oike et al.

(10) Patent No.: US 12,765,093 B2
(45) Date of Patent: Oct. 13, 2026

(54) RADIATION IMAGING APPARATUS, RADIATION IMAGING SYSTEM, AND METHOD OF MANUFACTURING RADIATION IMAGING APPARATUS

(71) Applicant: CANON KABUSHIKI KAISHA, Tokyo (JP)

(72) Inventors: Tomoyuki Oike, Kanagawa (JP); Tamaki Kobayashi, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 299 days.

(21) Appl. No.: 18/358,131

(22) Filed: Jul. 25, 2023

(65) Prior Publication Data

US 2024/0072085 A1 Feb. 29, 2024

(30) Foreign Application Priority Data

Aug. 29, 2022 (JP) ................................ 2022-136236

(51) Int. Cl.
*H10F 39/00* (2025.01)
*G01T 1/202* (2006.01)
*H10F 39/18* (2025.01)

(52) U.S. Cl.
CPC ........... *H10F 39/804* (2025.01); *G01T 1/202* (2013.01); *H10F 39/011* (2025.01); *H10F 39/1898* (2025.01)

(58) Field of Classification Search
CPC .. H10F 39/804; H10F 39/011; H10F 39/1898; G01T 1/202
See application file for complete search history.

(56) References Cited

U.S. PATENT DOCUMENTS

| | | | |
|---|---|---|---|
| 7,732,788 B2 | 6/2010 | Ohbayashi | |
| 8,884,231 B2 | 11/2014 | Noda | |
| 10,067,242 B2 | 9/2018 | Ishida et al. | |
| 2007/0051896 A1* | 3/2007 | Okada | G01T 1/202 250/370.11 |
| 2012/0126128 A1* | 5/2012 | Watanabe | H10F 39/026 250/361 R |
| 2022/0221597 A1 | 7/2022 | Beranger et al. | |

FOREIGN PATENT DOCUMENTS

| | | | |
|---|---|---|---|
| JP | 2005-172511 A | 6/2005 | |
| JP | 2009-103676 A | 5/2009 | |
| JP | 2011128085 A * | 6/2011 | H10F 39/1898 |
| JP | 2012-118058 A | 6/2012 | |
| JP | 2022-532622 A | 7/2022 | |
| WO | 2020/229499 A1 | 11/2020 | |

* cited by examiner

*Primary Examiner* — Uzma Alam
*Assistant Examiner* — Richard O Toohey
(74) *Attorney, Agent, or Firm* — Venable LLP

(57) ABSTRACT

A radiation imaging apparatus in which a sensor substrate and a scintillator are bonded by a bonding member, is provided. The scintillator includes a first surface opposing the sensor substrate via the bonding member and covered by a first protective layer, a second surface disposed on an opposite side of the first surface and covered by a second protective layer, and a third surface connecting the first surface and the second surface and covered by a third protective layer. The first protective layer, the second protective layer, and the third protective layer are each configured by one or more layers, and a number of layers of the first protective layer is less than or equal to respective numbers of layers of the second protective layer and the third protective layer.

5 Claims, 5 Drawing Sheets

RADIATION IMAGING APPARATUS, RADIATION IMAGING SYSTEM, AND METHOD OF MANUFACTURING RADIATION IMAGING APPARATUS

BACKGROUND OF THE INVENTION

Field of the Invention

The present invention relates to a radiation imaging apparatus, a radiation imaging system, and a method of manufacturing the radiation imaging apparatus.

Description of the Related Art

Radiation imaging apparatuses are widely used in medical diagnostic imaging and non-destructive testing. International Publication No. 2020/229499 describes forming a scintillator on a substrate for scintillator formation, then fixing the formed scintillator to a sensor substrate, and thereafter separating the substrate for scintillator formation from the scintillator. According to International Publication No. 2020/229499, since the substrate for scintillator formation is not used in the radiation imaging apparatus, it is possible to select a material that is suitable for the formation of scintillators as a material of the substrate without considering radiation transparency, light reflectivity, and the like.

SUMMARY OF THE INVENTION

Since scintillators can deliquesce due to moisture contained in the outside air, a protective layer is formed after a scintillator is formed. In a process described in International Publication No. 2020/229499, when a scintillator is formed, a protective layer may be formed on the top and side surfaces of the scintillator. Furthermore, when the substrate for scintillator formation is separated from the scintillator, a protective layer may be formed on the surface of the scintillator from which the substrate for scintillator formation was separated. When the number of layers of a protective layer disposed between the scintillator and the sensor substrate increases due to a protective layer being formed a plurality of times, light emitted by the scintillator is scattered within the protective layers; thus, there is a possibility that the image quality of an obtained image will degrade.

Some embodiments of the present invention provide a technique that is advantageous in suppressing degradation of image quality.

According to some embodiments, a radiation imaging apparatus in which a sensor substrate and a scintillator are bonded by a bonding member, the scintillator comprising: a first surface opposing the sensor substrate via the bonding member and covered by a first protective layer; a second surface disposed on an opposite side of the first surface and covered by a second protective layer; and a third surface connecting the first surface and the second surface and covered by a third protective layer, wherein the first protective layer, the second protective layer, and the third protective layer are each configured by one or more layers, and wherein a number of layers of the first protective layer is less than or equal to respective numbers of layers of the second protective layer and the third protective layer, is provided.

According to some other embodiments, a method of manufacturing a radiation imaging apparatus in which a sensor substrate and a scintillator sealed by a protective layer configured by one or more layers are bonded by a bonding member, the method comprising: forming a scintillator on a first substrate; forming a first layer of the protective layer so as to cover the scintillator disposed on the first substrate; bonding the scintillator to a second substrate such that the scintillator is disposed between the first substrate and the second substrate; separating the first substrate from the scintillator bonded to the second substrate; and after the separating, forming a second layer of the protective layer so as to cover the scintillator disposed on the second substrate, is provided.

Further features of the present invention will become apparent from the following description of exemplary embodiments (with reference to the attached drawings).

DESCRIPTION OF THE EMBODIMENTS

Figure 1A:
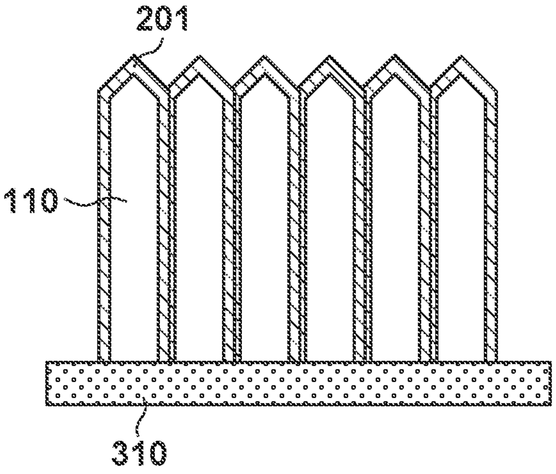
FIGS. 1A to 1D are sectional views illustrating an example of a process of a method of manufacturing a radiation imaging apparatus of the present embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

In addition, radiation in the present disclosure may include α-rays, β-rays, γ-rays and the like, which are beams made of particles (including photons) emitted by radioactive decay, as well as beams of similar or higher energy, such as X-rays, particle rays, and cosmic rays.

A radiation imaging apparatus and a method of manufacturing the radiation imaging apparatus according to an embodiment of the present disclosure will be described with reference to FIGS. 1A to 4. FIGS. 1A to 1D are sectional views illustrating an example of a process of manufacturing a radiation imaging apparatus 100 of the present disclosure.

Figure 1B:
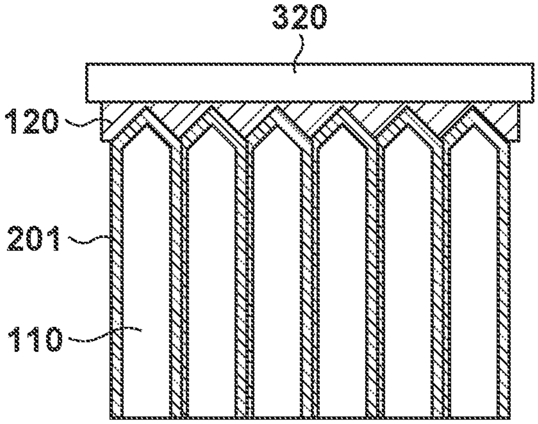
Figure 1C:
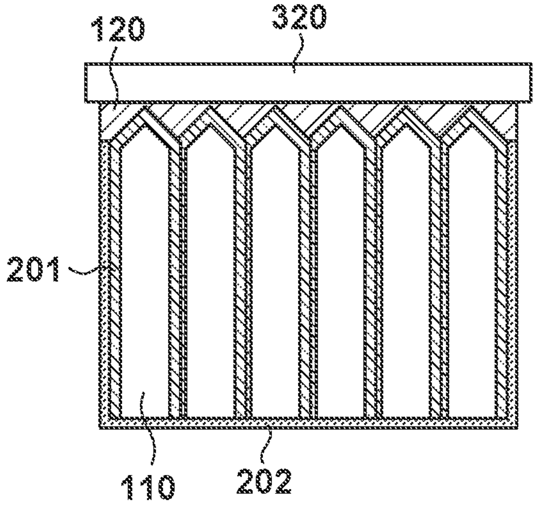
Figure 1D:
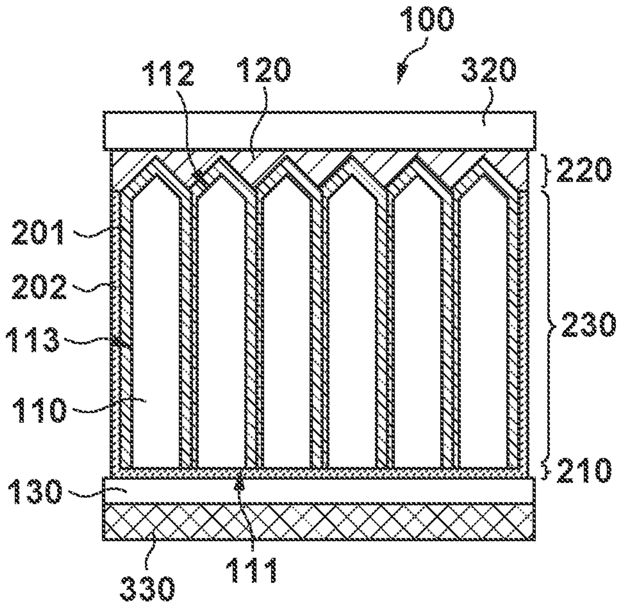

As illustrated in FIG. 1D, the radiation imaging apparatus 100, a sensor substrate 330 and a scintillator 110 are bonded by a bonding member 130. A plurality of pixels are disposed on the sensor substrate 330. Each of the plurality of pixels is sensitive to light into which radiation is converted in the scintillator 110 and generates charge corresponding to the incident light. On the sensor substrate 330, a plurality of pixels may be arranged so as to form rows and columns. The sensor substrate 330 may include a semiconductor (silicon, etc.) layer on which a plurality of pixels are disposed on an insulating base made of glass or the like. In addition, for example, a base made of resin, such as polyimide which is flexible, may be used for the sensor substrate 330. In addition, regarding the sensor substrate 330, a plurality of pixels may be formed on the silicon substrate.

The scintillator 110 converts radiation that is incident on the scintillator 110 into light that pixels disposed on the sensor substrate 330 are sensitive to. The scintillator 110 may have a needle-like (columnar) crystalline structure containing an alkali metal halide compound. The scintillator 110 having a needle-like crystalline structure mainly containing an alkali metal halide compound may be, for example, cesium iodide to which thallium is added as an activator agent (CsI:Tl). However, the present invention is not limited to this, and the scintillator 110 may be sodium activated cesium iodide (CsI:Na), cesium bromide (CsBr), or the like. However, the present invention is not limited to this, and other materials may be used. In the following, description will be given assuming that CsI:Tl is used for the scintillator 110.

Here, as illustrated in FIG. 1D, a surface of the scintillator 110 opposing the sensor substrate 330 across the bonding member 130 is referred to as surface 111. In addition, a surface of the scintillator 110 disposed on an opposite side of the surface 111 is referred to as surface 112. Furthermore, a side surface of the scintillator 110 connecting the surface 111 and the surface 112 is referred to as surface 113.

The surface 111 of the scintillator 110 is covered by a protective layer 210. The surface 112 of the scintillator 110 is covered by a protective layer 220. The surface 113 of the scintillator 110 is covered by a protective layer 230. It can be said that the scintillator 110 is sealed by the protective layers 210, 220, and 230. Each of the protective layers 210, 220 and 230 is formed by a process to be described later and is constituted by one or more layers.

The bonding member 130 is a member, such as an adhesive, for bonding the sensor substrate 330 and the scintillator 110. Various resin materials can be used for the bonding member 130. For example, thermoplastic resin may be used for the bonding member 130. For example, hot melt resin, such as polyester-based resin, polyolefin-based resin, and polyamide-based resin, may be used for the bonding member 130. For example, the sensor substrate 330 and the scintillator 110 may be bonded via the bonding member 130 by thermocompression bonding.

Next, a method for manufacturing the radiation imaging apparatus 100 will be described. First, as illustrated in FIG. 1A, a substrate 310 is prepared. In the present embodiment, the substrate 310 that is used when forming the scintillator 110 is separated from the scintillator 110 in a subsequent step. Therefore, it is possible to use for the substrate 310 a material that is suitable for the formation of the scintillator 110. Any material may be used for the substrate 310 so long as the material can withstand a step of forming the scintillator, for example a material that can withstand the temperature at the time of forming the scintillator 110. For example, a resin material, such as PET, polyurethane, polyimide, or polyamide-imide, may be used for the substrate 310. In addition, beryllium, magnesium, aluminum, titanium, iron, or an alloy or the like containing these as a main component may be used for the substrate 310.

The scintillator 110 is formed on the substrate 310. The scintillator 110 may be formed on the substrate 310 using a vapor deposition method. In addition, the scintillator 110 may be formed using any method, such as a sublimation method, a plasma deposition method, an atomizing method, or growth in a liquid medium accompanied by solvent evaporation.

Subsequently to the step of forming the scintillator 110, a protective layer 201 is formed so as to cover the scintillator 110 disposed on the substrate 310. More specifically, the protective layer 201 is formed so as to cover the upper surface and the side surfaces of the scintillator 110 formed on the substrate 310. As illustrated in FIG. 1D, in the radiation imaging apparatus 100, the protective layer 201 constitutes a layer contacting the scintillator 110 in the protective layer 220 and the protective layer 230 covering the surface 112 and the surface 113 of the scintillator 110.

For example, a monomolecular layer containing silicon oxide, which is a condensation polymer for which a metal alkoxide, such as ethyl silicate or methoxysilane, is used as a raw material and which is obtained by hydrolysis, may be used for the protective layer 201. In addition, for example, silicon oxide for which polysilazane-based inorganic polymer, which is made of silicon, nitrogen, and hydrogen and includes perhydropolysilazane, is used as a raw material may be used for the protective layer 201. Furthermore, for example, polyparaxylene and the like for which parylene dimer is used as a raw material may be used for the protective layer 201. A moisture-proof material is used for the protective layer 201. In addition, the protective layer 201 may be a combination of two or more above-described materials. By promptly forming the protective layer 201 after forming the scintillator 110, it is possible to suppress the scintillator 110 being exposed to outside air. In addition, for example, configuration may be taken so as to convey the substrate 310 on which the scintillator 110 has been formed from an apparatus for forming the scintillator 110 to an apparatus for forming the protective layer 201 in a vacuum or an inert gas atmosphere and form the protective layer 201.

The protective layer 201 may be formed using a method in which liquid materials are used, such as a spin coating method, a spray coating method, a dip coating method, a flow coating method, or a bar coating method. In addition, for example, the protective layer 201 may be formed by supplying a raw material gas in a vapor deposition method. By selecting a suitable method, it is possible to form the protective layer 201 at a desired thickness on the scintillator 110. In any of the methods, it is possible to uniformly supply the raw material of the protective layer 201 even when the substrate has increased in surface area. If necessary, at the time of forming the protective layer 201 or after forming the protective layer 201, a chemical reaction may be promoted by increasing temperature, applying heat, or supplying steam to an extent that does not deliquesce the columnar crystals of the scintillator 110.

The thickness of the protective layer 201 may be 1/50 or less of the column diameter of the columnar crystal of the scintillator 110. The thickness of the layer (protective layer 201) contacting the scintillator 110 in the protective layer 230 may be 1/50 or less of the columnar diameter of the columnar crystal of the scintillator 110. If the protective layer 201 is thick, the gaps between the columnar crystals of the scintillator 110 will be filled, and there will be a possibility that light will be scattered or guided from a columnar crystal that emitted light to another columnar crystal. As a result, there is a possibility that a spatial resolution of the radiation imaging apparatus 100 will degrade.

After forming the protective layer 201, as illustrated in FIG. 1B, the scintillator 110 is transferred to a substrate 320. First, a bonding step of bonding the scintillator 110 to the substrate 320 is performed such that the scintillator 110 is disposed between the substrate 310 and the substrate 320. The scintillator 110 and the substrate 320 may be bonded via a bonding member 120 in which a resin material, such as an adhesive, is used. A material similar to the above-described bonding member 130 may be used as the bonding member 120.

Then, a separation step of separating the substrate 310 from the scintillator 110 bonded to the substrate 320 is performed. The separation step may be performed using a chemical or mechanical method. For example, the separation step may be performed by applying a force so as to separate the substrate 310 and the substrate 320. In this case, a bonding force between the substrate 320 and the scintillator 110 (protective layer 201) via the bonding member 120 needs to be greater than a bonding force between the substrate 310 and the scintillator 110. In addition, for example, before separating the substrate 310 from the scintillator 110, a step of weakening the bonding force between the substrate 310 and the scintillator 110 may be added. In addition, for example, before forming the scintillator 110, processing for weakening an adhesive force between the substrate 310 and the scintillator 110 may be performed.

When the separation step of the substrate 310 is completed, as illustrated in FIG. 1B, the surface that had been in contact with the substrate 310 of the scintillator 110 is exposed; thus, it is necessary to suppress the scintillator 110 being exposed to outside air. Therefore, as illustrated in FIG. 1C, a protective layer 202 is formed so as to cover the scintillator 110 disposed on the substrate 320. As illustrated in FIG. 1D, in the radiation imaging apparatus 100, the protective layer 202 constitutes one layer of the protective layer 210 and the protective layer 230 covering the surface 111 and the surface 113 of the scintillator 110. The protective layer 202 may constitute a portion of the protective layer 220 by covering a portion of the surface 112 of the scintillator 110.

The protective layer 202 may be formed using the same material as that of the protective layer 201. In this case, the protective layer 202 may be formed using the same method as that of the protective layer 201. By forming the protective layer 201 and the protective layer 202 using the same material and method, in a process for manufacturing the radiation imaging apparatus 100, it is possible to use the same apparatuses for forming the protective layers 201 and 202 and suppress the manufacturing cost. However, the present invention is not limited to this, and the protective layer 201 and the protective layer 202 may be formed using different materials from each other. In addition, the protective layer 201 and the protective layer 202 may be formed using different methods from each other.

After forming the protective layer 202, as illustrated in FIG. 1D, the scintillator 110 is transferred to the sensor substrate 330. A bonding step of bonding the scintillator 110 to the sensor substrate 330 via the bonding member 130 is performed such that the scintillator 110 is disposed between the substrate 320 and the sensor substrate 330. By including the above steps in the method, the radiation imaging apparatus 100 is obtained. The substrate 320 does not go through the step of forming the scintillator 110 like the substrate 310. Therefore, it is possible to use a suitable material that can be incorporated into the radiation imaging apparatus 100 so long as it can support the scintillator 110 in the steps illustrated in FIGS. 1B and 1C. Thus, as illustrated in FIG. 1D, the substrate 320 may remain bonded with the scintillator 110. However, the present invention is not limited to this, and the substrate 320 may be separated from the scintillator 110.

Here, the number of layers of the protective layers 210, 220, and 230 covering the scintillator 110 of the radiation imaging apparatus 100 will be described. By the above-described process, the protective layer 210 covering the surface 111 of the scintillator 110 opposing the sensor substrate 330 is constituted by one layer, which is the protective layer 202. The protective layer 220 covering the surface 112 of the scintillator 110 is constituted by the protective layer 201 (and the bonding member 120 and the substrate 320). The protective layer 230 covering the surface 113 of the scintillator 110 is constituted by the protective layer 201 and the protective layer 202. That is, the number of layers of the protective layer 210 is less than or equal to the respective numbers of layers of the protective layer 220 and the protective layer 230.

When a protective layer is formed each time the surface of the scintillator 110 is exposed as described above, the number of layers of the protective layer increases due to a protective layer being formed a plurality of times. When the number of layers of the protective layer increases, there is a possibility that light generated in the scintillator 110 will be scattered at a boundary between a protective layer and a protective layer. In addition, when the number of layers of the protective layer increases, the thickness of the protective layer may increase. When the film thickness of the protective layer increases, a distance between the scintillator 110 and the sensor substrate 330 increases; thus, there is a possibility that light generated in the scintillator 110 will be scattered in the protective layer. When light is scattered in the protective layer, there is a possibility that the image quality of an image obtained by the radiation imaging apparatus 100 will degrade. Therefore, by using the process as described above, the number of layers of the protective layer disposed between the scintillator 110 and the sensor substrate 330 is suppressed. Thus, it is possible to suppress degradation in image quality of an image obtained by the radiation imaging apparatus 100 while increasing the reliability by sealing the scintillator 110 using the protective layer.

In the process illustrated in FIGS. 1A to 1D, a protective layer (protective layers 201 and 202) is formed over a plurality of times on a side surface (surface 113) of the scintillator 110. Therefore, the number of layers of the protective layer 210 may be smaller than the number of layers of the protective layer 230. In addition, from the viewpoint of image quality of an image obtained by the radiation imaging apparatus 100, the film thickness of the protective layer 210 may be less than or equal to the respective film thicknesses of the protective layer 220 and the protective layer 230. Furthermore, the film thickness of the protective layer 210 may be smaller than the film thickness of the protective layer 230.

Further, in the process illustrated in FIGS. 1A to 1D, the scintillator 110 formed on the substrate 310 is first transferred to the substrate 320 and then transferred to the sensor substrate 330. However, the present invention is not limited to this, and the substrate 320 may be the sensor substrate. In that case, in the step illustrated in FIG. 1C, the radiation imaging apparatus 100 is obtained. In this case, the scintillator 110 is bonded to the substrate 320 (sensor substrate) via the bonding member 120. In addition, the surface of the scintillator 110 opposing the substrate 320 (sensor substrate) via the bonding member 120 is covered by the protective layer 201. The surface of the scintillator 110 on an opposite side of the surface opposing the substrate 320 (sensor substrate) is covered by the protective layer 202. The side surfaces of the scintillator 110 are covered by the protective layers 201 and 202. That is, even in this case, the number of layers of the protective layer covering the surface of the scintillator 110 opposing the substrate 320 (sensor substrate) is less than or equal to the number of layers of the protective layer covering another surface. As a result, even when the substrate 320 is a sensor substrate, the above-described effects are obtained.

Figure 2A:
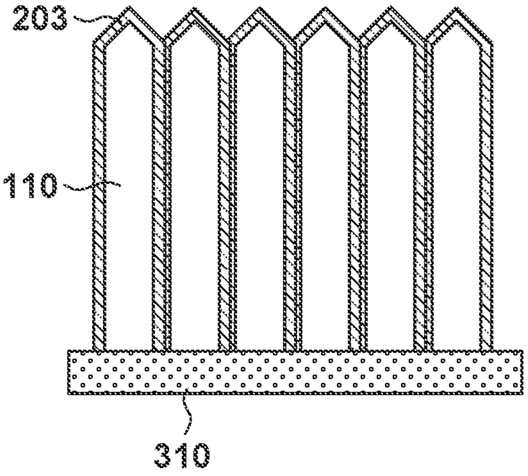
FIGS. 2A to 2F are sectional views illustrating an example of a process of the method of manufacturing the radiation imaging apparatus of the present embodiment.

Next, a description will be given for a variation of the above-described method of manufacturing the radiation imaging apparatus 100 with reference to FIGS. 2A to 2F. A step illustrated in FIG. 2A is similar to the above-described step illustrated in FIG. 1A. The scintillator 110 is formed on the substrate 310. Next, a protective layer 203 is formed so as to cover the scintillator 110 disposed on the substrate 310. For example, the materials described for the above-described protective layer 201 may be used for the protective layer 203.

Figure 2B:
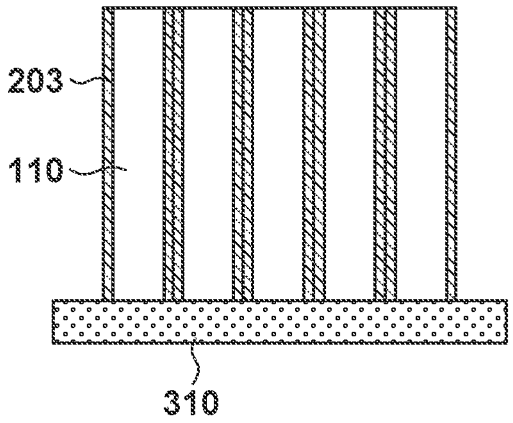

After forming the protective layer 203, as illustrated in FIG. 2B, a planarization step of planarizing a surface of the scintillator 110 on an opposite side of a surface contacting the substrate 310 is performed. At the time of forming the scintillator 110, there are cases where the columnar crystals grow abnormally and the unevenness of the surface of the scintillator 110 increases. To suppress the unevenness of the surface of the scintillator 110, the planarization step is performed. Regarding planarization processing, planarization may be performed by applying pressure to the surface of the scintillator 110 using a flat plate, a roller, or the like. In addition, for example, a method of removing an abnormally grown portion of the columnar crystal of the scintillator 110 by cutting or the like may be used for the planarization processing. Any method may be used for the planarization method so long as the roughness of the surface of the scintillator 110 can be reduced.

Figure 2C:
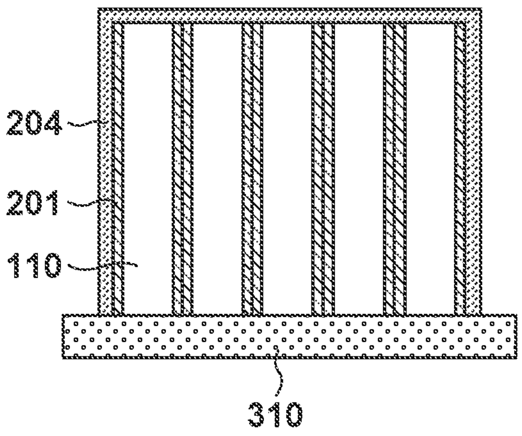

As illustrated in FIG. 2B, a planarized surface of the scintillator 110 may be exposed due to the planarization step. Therefore, after the planarization step, as illustrated in FIG. 2C, a layer formation step of forming a protective layer 204 so as to cover the scintillator 110 disposed on the substrate 310 is performed. The protective layer 204 may be formed using the same material as that of the protective layer 203. In this case, the protective layer 204 may be formed using the same method as that of the protective layer 203. However, the present invention is not limited to this, and the protective layer 203 and the protective layer 204 may be formed using different materials from each other. In addition, the protective layer 203 and the protective layer 204 may be formed using different methods from each other.

After forming the protective layer 204, the radiation imaging apparatus 100 may be manufactured by performing the above-described steps from FIG. 1B onward. In addition, the radiation imaging apparatus 100 may be manufactured using steps to be described below.

Figure 2D:
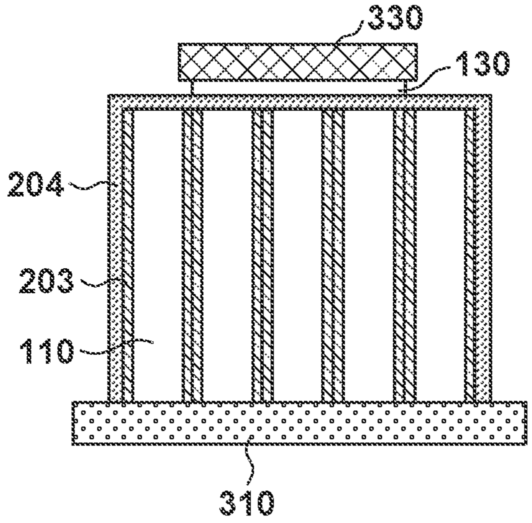

After forming the protective layer 204, as illustrated in FIG. 2D, a bonding step of bonding the scintillator 110 to the sensor substrate 330 via the bonding member 130 is performed. At this time, as illustrated in FIG. 2D, the bonding member 130 is disposed such that a portion of the scintillator 110 is bonded to the sensor substrate 330.

Then, a separation step of separating the scintillator 110 bonded to the sensor substrate 330 from the substrate 310 is performed. In this separation step, as illustrated in FIG. 2E, a part of the scintillator 110 bonded to the sensor substrate 330 is separated from the substrate 310, and another part of the scintillator 110 not bonded to the sensor substrate 330 remains on the substrate 310.

Figure 2E:
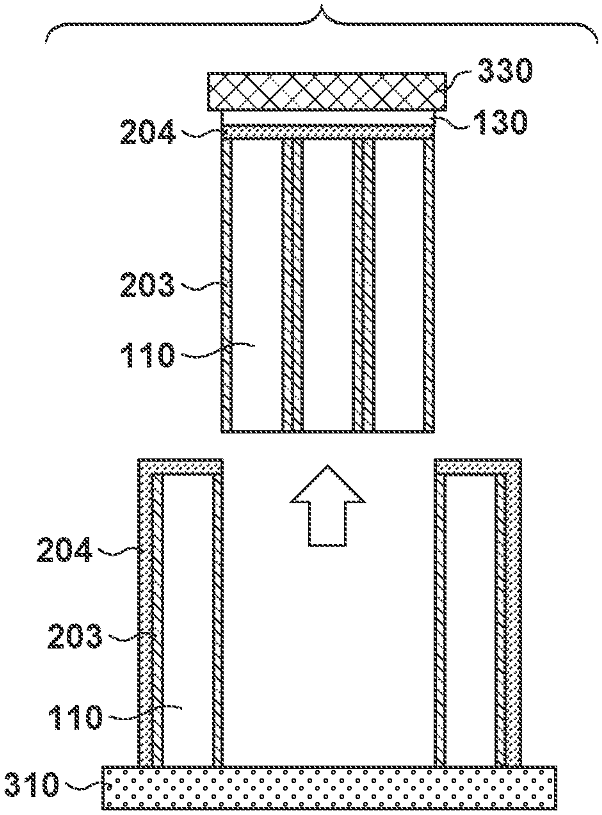

As illustrated in FIG. 2E, in the scintillator 110 formed on the substrate 310, the scintillator 110 at a central portion can be transferred to the sensor substrate 330. Thus, it is possible to suppress a portion in which crystallinity is low and a portion whose film thickness is thin at the outer edges of the scintillator 110 being used in the radiation imaging apparatus 100. In addition, in the present embodiment, a portion of the scintillator 110 formed on the substrate 310 is transferred to the sensor substrate 330 which is smaller than the substrate 310. As a result, it is possible to easily realize narrowing of a casing trim, which increases a proportion that the scintillator 110 occupies on the sensor substrate 330.

Figure 2F:
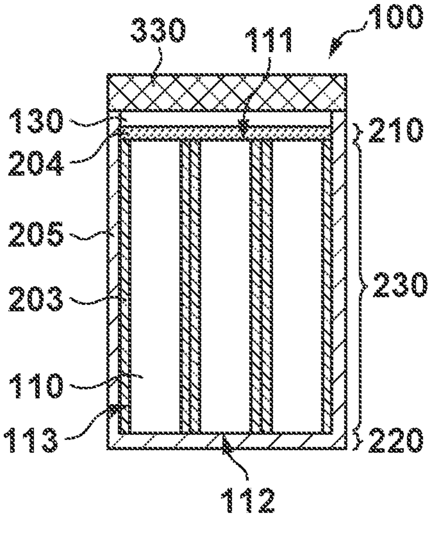

After separating a portion of the scintillator 110 from the substrate 310, a surface that had been in contact with the substrate 310 of the scintillator 110 is exposed. Therefore, as illustrated in FIG. 2F, a protective layer 205 is formed so as to cover the scintillator 110 disposed on the sensor substrate 330. The protective layer 205 may be formed using the same material as that of the protective layer 203. In this case, the protective layer 205 may be formed using the same method as that of the protective layer 203. In addition, the protective layers 203, 204, and 205 may be formed using the same material. In this case, the protective layers 203, 204, and 205 may be formed using the same method. However, the present invention is not limited to this, and the protective layer 203, the protective layer 204, and the protective layer 205 may be formed using different materials from each other. In addition, the protective layer 203, the protective layer 204, and the protective layer 205 may be formed using different methods from each other.

By including the above steps in the method, the radiation imaging apparatus 100 illustrated in FIG. 2F is obtained. When the process described in FIGS. 2A to 2F is used, the protective layer 210 covering the surface 111 of the scintillator 110 opposing the sensor substrate 330 is constituted by the protective layer 204. The protective layer 220 covering the surface 112 of the scintillator 110 on an opposite side of the surface 111 is constituted by the protective layer 205. The protective layer 230 covering the surface 113 of the scintillator 110, which is a side surface connecting the surface 111 and the surface 112, is constituted by the protective layer 203 and the protective layer 205. That is, also in the present embodiment, the number of layers of the protective layer 210 is less than or equal to the respective numbers of layers of the protective layer 220 and the protective layer 230. In addition, the number of layers of the protective layer 210 is smaller than the number of layers of the protective layer 230. Furthermore, the film thickness of the protective layer 210 may be less than or equal to the respective film thicknesses of the protective layer 220 and the protective layer 230, or the film thickness of the protective layer 210 may be smaller than the film thickness of the protective layer 230. Similarly to the above, by suppressing the number of layers and the thickness of the protective layer 210 disposed between the scintillator 110 and the sensor substrate 330, it is possible to suppress the light generated by the scintillator 110 being scattered within the protective layer 210. As a result, degradation of the image quality of an image obtained by the radiation imaging apparatus 100 is suppressed.

Figure 3C:
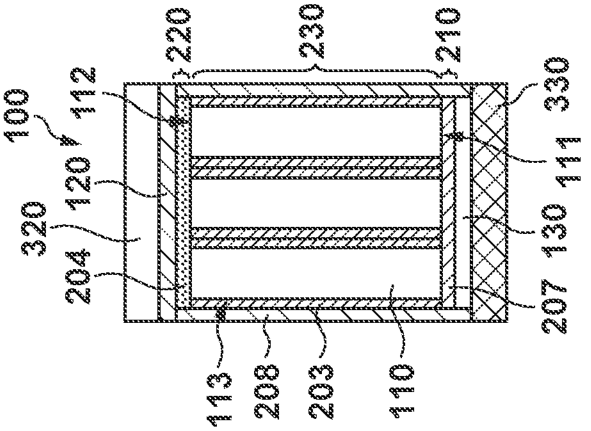
FIGS. 3A to 3C are sectional views illustrating an example of a process of the method of manufacturing the radiation imaging apparatus of the present embodiment.

A description will be given for a variation of the method of manufacturing the radiation imaging apparatus 100, which has been described with reference to FIGS. 2A to 2F, with reference to FIGS. 3A to 3C. Up until the step illustrated in FIG. 2C, the steps are similar to the above-described steps. After forming the protective layer 204, in the step illustrated in FIG. 2D, the sensor substrate 330 and the scintillator 110 are bonded. Meanwhile, in the process illustrated in FIG. 3A, similarly to the step described with reference to FIG. 1B, the scintillator 110 is bonded to the substrate 320 via the bonding member 120, and then the scintillator 110 is separated from the substrate 310. At this time, a portion of a surface of the scintillator 110 that had been in contact with the substrate 310 may be removed. Generally, in a CsI vapor deposition process, fine crystal nuclei are formed on the substrate at the early stages of film formation and columnar crystals grow thereon. By removing an initial layer of the scintillator 110 formed on the substrate 310, which is from the early stages of growth and is prone to light scattering, the characteristics of the scintillator 110 may improve.

Figure 3B:
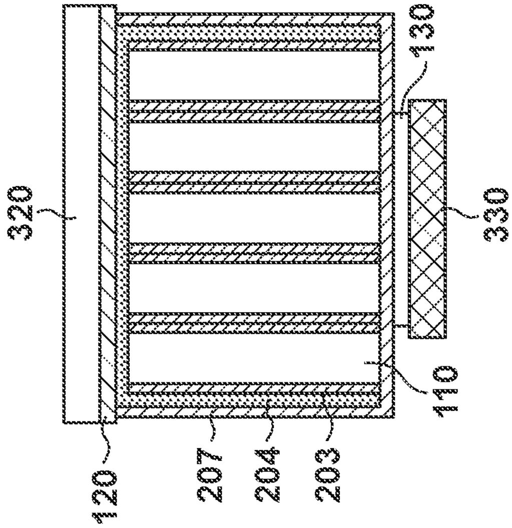
Figure 3A:
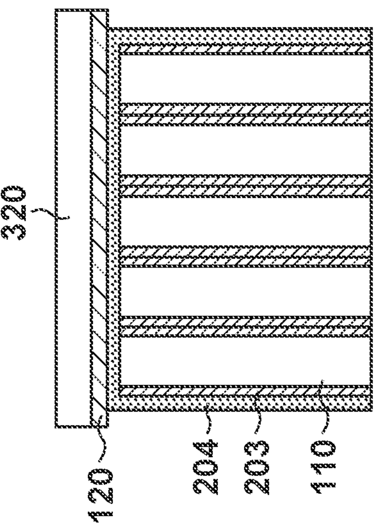

After removing the initial layer of the scintillator 110, as illustrated in FIG. 3B, a protective layer 207 is formed. The protective layer 207 may be formed using the same material as that of the protective layer 203. In this case, the protective layer 207 may be formed using the same method as that of the protective layer 203. In addition, the protective layers 203, 204, and 207 may be formed using the same material. In this case, the protective layers 203, 204, and 207 may be formed using the same method. However, the present invention is not limited to this, and the protective layer 203, the protective layer 204, and the protective layer 207 may be formed using different materials from each other. In addition, the protective layer 203, the protective layer 204, and the protective layer 207 may be formed using different methods from each other.

After forming the protective layer 207, as illustrated in FIG. 3B, a bonding step of bonding the scintillator 110 to the sensor substrate 330 via the bonding member 130 is performed. At this time, similarly to the step illustrated in FIG. 2D, the bonding member 130 is disposed such that a portion of the scintillator 110 is bonded to the sensor substrate 330.

Then, as illustrated in FIG. 3C, an outer edge portion of the scintillator 110 and the substrate 320 are cut and removed using a rotary cutting machine or the like. By this, as illustrated in FIG. 3C, in the scintillator 110 formed on the substrate 310, the scintillator 110 at a central portion can be transferred to the sensor substrate 330. Thus, it is possible to suppress a portion in which crystallinity is low and a portion whose film thickness is thin at the outer edges of the scintillator 110 being used in the radiation imaging apparatus 100. In addition, in the present embodiment, a portion of the scintillator 110 formed on the substrate 310 is transferred to the sensor substrate 330 smaller than the substrate 310. As a result, it is possible to easily realize narrowing of a casing trim, which increases a proportion that the scintillator 110 is occupying on the sensor substrate 330.

After cutting and removing the outer edges of the scintillator 110, a cut surface of the scintillator 110 may be exposed. This is because, although in FIG. 3C the columnar crystals of the scintillator 110 are drawn as though they are covered by the protective layer 203, there is a possibility that an outer edge portion of the scintillator 110 will be cut not only between the columnar crystals of the scintillator 110 but so as to cut the columnar crystal. Therefore, as illustrated in FIG. 3C, a protective layer 208 is formed so as to cover a side surface (surface 113) of the scintillator 110. In the present embodiment, by removing the outer edges of the scintillator 110 together with the substrate 320, a central portion of the scintillator 110 is transferred to the sensor substrate 330. However, the present invention is not limited to this, and a portion of the scintillator 110 may be transferred to the sensor substrate 330 using a step as illustrated in the above-described FIG. 2E. In that case, in the radiation imaging apparatus 100, the protective layer 208 covers not only the surface 113 but also the surface 112.

The protective layer 208 may be formed using the same material as that of the protective layer 203. In this case, the protective layer 208 may be formed using the same method as that of the protective layer 203. In addition, the protective layers 203, 204, 207, and 208 may be formed using the same material. In this case, the protective layers 203, 204, 207, and 208 may be formed using the same method. However, the present invention is not limited to this, and the protective layer 203, the protective layer 204, the protective layer 207, and the protective layer 208 may be formed using different materials from each other. In addition, the protective layer 203, the protective layer 204, the protective layer 207, and the protective layer 208 may be formed using different methods from each other.

By including the above steps in the method, the radiation imaging apparatus 100 illustrated in FIG. 3C is obtained. When the processes described in FIGS. 2A to 2C and FIGS. 3A to 3C are used, the protective layer 210 covering the surface 111 of the scintillator 110 opposing the sensor substrate 330 is constituted by the protective layer 207. The protective layer 220 covering the surface 112 of the scintillator 110 on an opposite side of the surface 111 is constituted by the protective layer 204. The protective layer 230 covering the surface 113 of the scintillator 110, which is a side surface connecting the surface 111 and the surface 112, is constituted by the protective layer 203 and the protective layer 208. That is, also in the present embodiment, the number of layers of the protective layer 210 is less than or equal to the respective numbers of layers of the protective layer 220 and the protective layer 230. In addition, the number of layers of the protective layer 210 is smaller than the number of layers of the protective layer 230. Furthermore, the film thickness of the protective layer 210 may be less than or equal to the respective film thicknesses of the protective layer 220 and the protective layer 230, or the film thickness of the protective layer 210 may be smaller than the film thickness of the protective layer 230. Similarly to the above-described configurations, by suppressing the number of layers and the thickness of the protective layer 210 disposed between the scintillator 110 and the sensor substrate 330, it is possible to suppress the light generated by the scintillator 110 being scattered within the protective layer 210. As a result, degradation of the image quality of an image obtained by the radiation imaging apparatus 100 is suppressed.

Next, embodiments will be described.

First Embodiment

The radiation imaging apparatus 100 as illustrated in FIG. 1D was formed. CsI:Tl was formed as the scintillator 110 on the glass substrate 310. More specifically, a material supply source filled with cesium iodide as a raw material of a mother substance of vapor deposition, a material supply source filled with thallium iodide as a raw material of an activator agent of vapor deposition, and the glass substrate 310 were disposed in a vacuum vapor deposition apparatus. The air in the vapor deposition apparatus was evacuated until it was 0.01 Pa or below. Then, current was caused to gradually flow across each material supply source to heat the material supply source, and when a set temperature was reached, by opening a shutter provided between the substrate and the material supply source while rotating the substrate 310, film formation of the scintillator 110 was started. A substrate temperature gradually increased from 80° C. to 160° C. The progress of film formation was confirmed, and when the scintillator 110 was formed to a desired film thickness, the film formation was ended by closing the shutter. After cooling the substrate 310 and the material supply source to room temperature, ethyl silicate was promptly brought into contact with the scintillator 110 using a vapor deposition method, and the protective layer 201 was formed.

Then, the scintillator 110 was bonded to the substrate 320, for which amorphous carbon was used, using a resin adhesive as the bonding member 120. Then, the substrate 310 was separated from the scintillator 110, and the protective layer 202 was formed. The protective layer 202 was formed by applying a solution raw material, in which a very small amount of perhydropolysilazane is included in a dibutyl ether solvent, using a spray coating method, and drying at 50° C. for 3 hours. After the protective layer 202 was formed, the sensor substrate 330, which includes an array of pixels (optical sensor), and the scintillator 110 on which the protective layer 202 was formed are bonded via a resin adhesive material as the bonding member 130, and the radiation imaging apparatus 100 was thereby obtained as illustrated in FIG. 1D.

Spatial resolution characteristic evaluations can be quantitatively compared by measuring a modulation transfer function (MTF). In the formed radiation imaging apparatus 100 illustrated in FIG. 1D, an image was obtained by irradiating an X-ray from the substrate 320 side according to the international standard beam quality RQAS. An MTF (2) at a spatial frequency of 2 Lp/mm, which is a spatial resolution index of the radiation imaging apparatus 100, was obtained by an edge method in which a tungsten knife edge is used. The radiation imaging apparatus 100 was stored under the environment of 25° C. temperature and 50% humidity, and an MTF was measured every number of days elapsed. When the values of MTF (2) at an early stage and 30 days later were compared, almost no degradation of spatial resolution was observed, and it was found that high spatial resolution and moisture resistance can both be achieved. Further, since the scintillator can be uniformly disposed to the outer edges of the sensor substrate 330, the surface distribution of the obtained image is reduced; thus, the effect of narrowing of a casing trim could be confirmed.

Second Embodiment

The radiation imaging apparatus 100 as illustrated in FIG. 3C was formed. Similarly to the first embodiment, CsI:Tl was used as the scintillator 110. Then, ethyl silicate was brought into contact with the scintillator 110 using a vapor deposition method, and the protective layer 201 was formed.

After forming the protective layer 201, planarization processing was performed by polishing 10 μm from the distal end side of the columnar crystal of the scintillator 110 using a dry planar polishing apparatus. After planarizing the surface of the scintillator 110, methoxysilane was brought into contact using a vapor deposition method so as to cover the planarized surface and the protective layer 204 was formed.

After forming the protective layer 204, the scintillator 110 was bonded to the aluminum substrate 320 using a resin adhesive as the bonding member 120. Then, the substrate 310 was separated from the scintillator 110. Since the surface that had been in contact with the substrate 310 of the scintillator 110 is exposed, the protective layer 207 was formed by bringing methoxysilane in contact with the scintillator 110 disposed on the substrate 320 using a vapor deposition.

After the protective layer 207 was formed, the sensor substrate 330, which includes an array of pixels (optical sensor), and the scintillator 110 were bonded via a resin adhesive material as the bonding member 130. Then, the outer edge portion of the scintillator 110 including the aluminum substrate 320 was cut and removed using a rotary cutting machine. After the removal of the outer edge portion of the scintillator 110, the protective layer 208 was formed. The protective layer 205 was formed by applying a solution raw material, in which a very small amount of perhydropolysilazane is included in a dibutyl ether solvent, using a spray coating method, and drying at 50° C. for 3 hours. With the above steps, the radiation imaging apparatus 100 illustrated in FIG. 3C was obtained.

In the formed radiation imaging apparatus 100 illustrated in FIG. 3C, an image was obtained by irradiating an X-ray from the substrate 320 side according to the international standard beam quality RQAS. An MTF (2) at a spatial frequency of 2 Lp/mm, which is a spatial resolution index of the radiation imaging apparatus 100, was obtained by an edge method in which a tungsten knife edge is used. The radiation imaging apparatus 100 was stored under the environment of 25° C. temperature and 50% humidity, and an MTF was measured every number of days elapsed. When the values of MTF (2) at an early stage and 30 days later were compared, almost no degradation of spatial resolution was observed, and it was found that high spatial resolution and moisture resistance can both be achieved. Further, since the scintillator can be uniformly disposed to the outer edges of the sensor substrate 330, the surface distribution of the obtained image is reduced; thus, the effect of narrowing of a casing trim could be confirmed.

Figure 4:
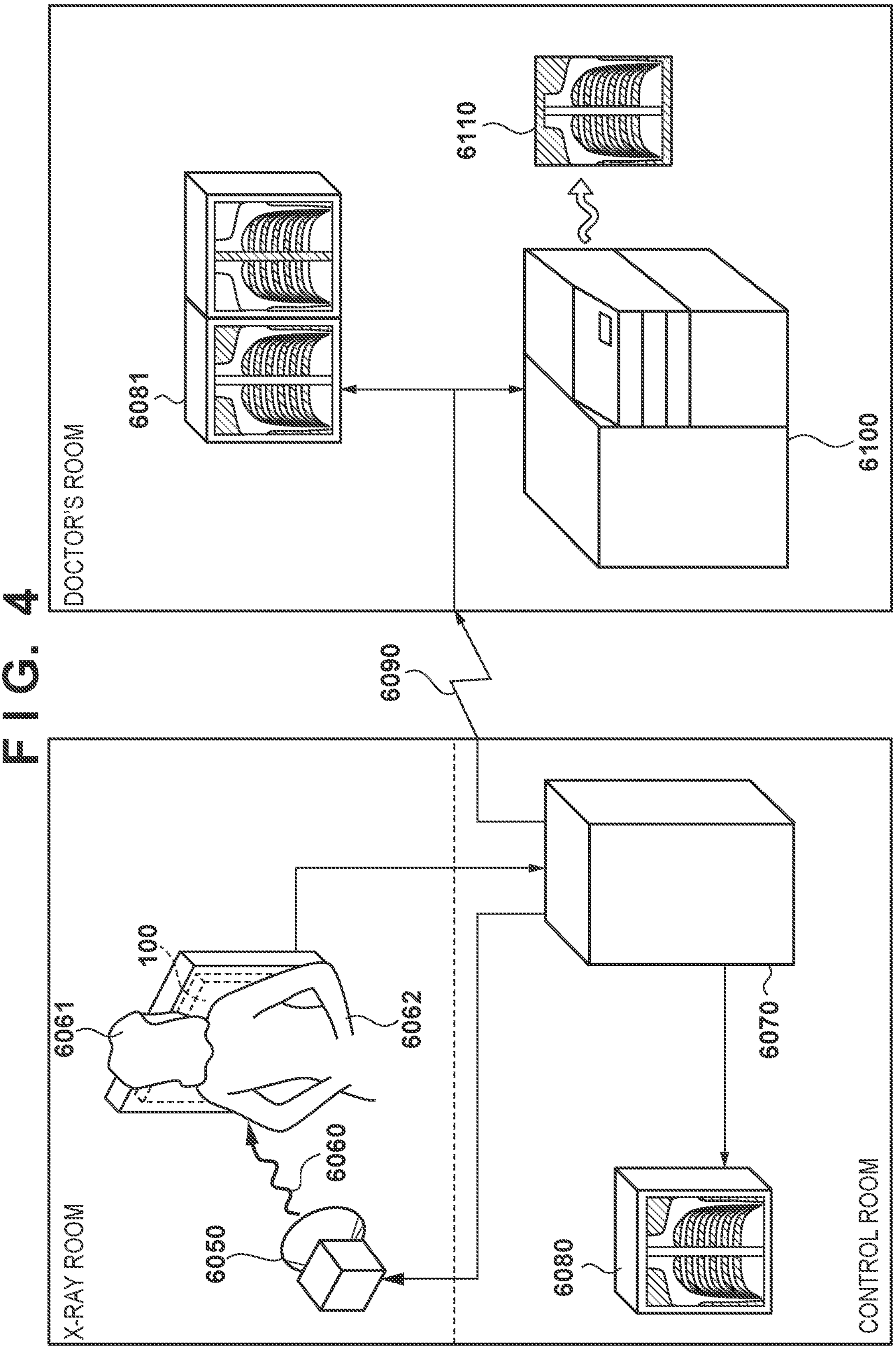
FIG. 4 is a diagram illustrating an example of a configuration of a radiation imaging system in which the radiation imaging apparatus of the present embodiment is used.

Hereinafter, a radiation imaging system, which incorporates the above-described radiation imaging apparatus 100, will be exemplarily described with reference to FIG. 4. An X-ray 6060, which has been generated in an X-ray tube 6050 which is a radiation source for emitting radiation to the radiation imaging apparatus 100, passes through a chest 6062 of a patient or subject 6061 and enters the radiation imaging apparatus 100. This incident X-ray includes information about the inside of the body of the patient or subject 6061. In the radiation imaging apparatus 100, the scintillator 110 emits light corresponding to the incident X-ray 6060; this is photoelectrically converted in a photoelectric conversion element, and electrical information is obtained. This information is converted to digital information, outputted to an image processor 6070 which serves as a signal processing unit, subjected to image processing by the image processor 6070, and can be observed on a display 6080 which serves as a display unit of a control room.

Furthermore, this information can be transferred to a remote location by a transfer processing unit, such as a phone line 6090. This makes it possible to display this information on a display 6081, which is a display unit of a remote doctor's room or the like, for a remote doctor to perform diagnosis. In addition, this information can be stored in a storage medium, such as an optical disk, as well as a film 6110, which serves as a storage medium, according to a film processor 6100.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-136236, filed Aug. 29, 2022, which is hereby incorporated by reference herein in its entirety.

What is claimed is:

1. A method of manufacturing a radiation imaging apparatus in which a sensor substrate and a scintillator sealed by a protective layer configured by one or more layers are bonded by a bonding member, the method comprising:

forming a scintillator on a first substrate;

forming a first layer of the protective layer so as to cover the scintillator disposed on the first substrate;

bonding the scintillator to a second substrate, which is the sensor substrate, such that the scintillator is disposed between the first substrate and the second substrate and such that only a first portion of the scintillator is bonded to the second substrate;

separating the first substrate from the scintillator bonded to the second substrate such that only the first portion of the scintillator is separated from the first substrate and such that a second portion, which is different from the first portion, of the scintillator remains on the first substrate; and after the separating, forming a second layer of the protective layer so as to cover the first portion of the scintillator disposed on the second substrate.

2. The manufacturing method according to claim 1, the method further comprising:

after the forming of the first layer and before the bonding of the scintillator to the second substrate, planarizing, in the scintillator, a surface that is on an opposite side of a side contacting the first substrate, and after the planarizing, forming a third layer of the protective layer so as to cover the scintillator disposed on the first substrate.

3. The manufacturing method according to claim 1, wherein the protective layer is formed using at least one method among a spin coating method, a spray coating method, a dip coating method, a flow coating method, a bar coating method, and a vapor deposition method.

4. The manufacturing method according to claim 3, wherein respective layers constituting the protective layer are formed using the same method.

5. The manufacturing method according to claim 1, wherein respective layers constituting the protective layer are formed using the same material.

* * * * *